(12) United States Patent
Gomez (10) Patent No.: US 10,798,821 B2
(45) Date of Patent: Oct. 6, 2020

(54) CIRCUIT BOARD HAVING A PASSIVE DEVICE INSIDE A VIA

(71) Applicant: INTEL CORPORATION, Santa Clara, CA (US)

(72) Inventor: Carlos Gomez, Round Rock, TX (US)

(73) Assignee: Intel Corporation, Santa Clara, CA (US)

( * ) Notice: Subject to any disclaimer, the term of this patent is extended or adjusted under 35 U.S.C. 154(b) by 880 days.

(21) Appl. No.: 15/089,482

(22) Filed: Apr. 2, 2016

(65) Prior Publication Data
US 2017/0290162 A1  Oct. 5, 2017

(51) Int. Cl.
| H05K 1/18 | (2006.01) |
| H05K 1/11 | (2006.01) |
| H05K 1/02 | (2006.01) |
| H05K 3/34 | (2006.01) |
| H05K 3/42 | (2006.01) |

(52) U.S. Cl.
CPC ........... H05K 1/184 (2013.01); H05K 1/0298 (2013.01); H05K 1/115 (2013.01); H05K 1/181 (2013.01); *H05K 3/34* (2013.01); *H05K 3/429* (2013.01); *Y02P 70/611* (2015.11)

(58) Field of Classification Search
CPC ...... H05K 1/184; H05K 1/0298; H05K 1/115; H05K 1/181; H05K 3/429; H05K 3/34
See application file for complete search history.

(56) References Cited

U.S. PATENT DOCUMENTS

| 6,621,012 | B2 * | 9/2003 | Crockett | ............. H05K 1/0231 174/255 |
| 7,271,349 | B2 | 9/2007 | Jessep et al. | |
| 7,459,200 | B2 | 12/2008 | McCall et al. | |
| 7,465,188 | B2 | 12/2008 | Tan et al. | |
| 7,501,586 | B2 | 3/2009 | Wig et al. | |
| 7,656,151 | B2 | 2/2010 | Perry | |
| 7,676,917 | B2 | 3/2010 | McCall et al. | |
| 8,044,305 | B2 | 10/2011 | Cai et al. | |
| 8,064,214 | B2 * | 11/2011 | Frasco | ................... H05K 1/184 174/260 |
| 8,284,562 | B2 * | 10/2012 | Lee | ........................ H05K 1/185 361/761 |
| 8,415,002 | B2 | 4/2013 | McCall et al. | |
| 8,665,580 | B2 | 3/2014 | Choi et al. | |
| 8,673,391 | B2 | 3/2014 | Shykind et al. | |
| 9,035,194 | B2 * | 5/2015 | Hossain | ................... H05K 3/42 174/260 |
| 9,131,603 | B2 | 9/2015 | Xiao et al. | |
| 9,202,782 | B2 | 12/2015 | Chuah | |
| 2003/0087498 | A1 * | 5/2003 | Galvagni | .......... H01L 23/49822 438/381 |
| 2008/0320523 | A1 | 12/2008 | Morris et al. | |
| 2013/0020675 | A1 | 1/2013 | Kireev et al. | |
| 2014/0069705 | A1 | 3/2014 | Lee et al. | |
| 2014/0092572 | A1 | 4/2014 | Hossain et al. | |
| 2014/0317343 | A1 | 10/2014 | Hossain et al. | |

(Continued)

*Primary Examiner* — Nathan Milakovich
(74) *Attorney, Agent, or Firm* — Schwabe, Williamson & Wyatt, P.C.

(57) ABSTRACT

A circuit board is provided that includes a plurality of insulating layers provided in a stack to have a first surface and a second surface. A via may extend from the first surface of the stack to the second surface of the stack. A passive device may be provided in the via.

15 Claims, 5 Drawing Sheets

(56) References Cited

U.S. PATENT DOCUMENTS

| | | | |
|---|---|---|---|
| 2018/0206333 A1* | 7/2018 | Shan | H05K 1/0231 |
| 2019/0208643 A1* | 7/2019 | Chuah | H05K 3/0035 |
| 2019/0239358 A1* | 8/2019 | Bartley | G02B 6/46 |

* cited by examiner

CIRCUIT BOARD HAVING A PASSIVE DEVICE INSIDE A VIA

BACKGROUND

1. Field

Embodiments may relate to a printed circuit board and passive devices such as inductors, capacitors and resistors.

2. Background

A printed circuit board (PCB) may have multiple signal routing layers containing conductive traces to transmit signals to and from components (or devices) mounted on the PCB. The PCB may also have a number of plated-through holes, or vias, used to connect specific traces on different signal routing layers. The vias may extend through one or more conductive layers (e.g., power and/or ground planes) and one or more insulating layers.

Passive devices (or components) such as inductors, capacitors and resistors may be fabricated and mounted as discrete components (or devices) on a PCB. For example, the passive components (or devices) may be mounted using techniques such as Surface Mount Technology (SMT) subsequent to fabrication of the circuit board. However, the mounted passive devices may consume space.

BRIEF DESCRIPTION OF THE DRAWINGS

Arrangements and embodiments may be described in detail with reference to the following drawings in which like reference numerals refer to like elements and wherein.

DETAILED DESCRIPTION

Any reference to "one embodiment" or "an embodiment" means that a particular feature, structure, or characteristic described in connection with the embodiment is included in at least one embodiment. The appearances of the phrases "in one embodiment" and "in an embodiment" in various places in the specification are not necessarily all referring to the same embodiment. Further, different embodiments may be combined with other embodiments.

Embodiments may relate to a circuit board having passive devices such as inductors, capacitors, resistors and associated techniques and configurations. In the following description, various aspects of the illustrative implementations may be described using terms commonly employed by those skilled in the art to convey the substance of their work to others skilled in the art. However, it may be apparent to those skilled in the art that embodiments may be practiced with only some of the described aspects. For purposes of explanation, specific numbers, materials and configurations are set forth in order to provide a thorough understanding of the illustrative implementations. However, it may be apparent to one skilled in the art that embodiments may be practiced without the specific details. In other instances, well-known features are omitted or simplified in order not to obscure the illustrative implementations.

The description may use perspective-based descriptions such as top/bottom, in/out, over/under, and the like. Such descriptions are merely used to facilitate the discussion and are not intended to restrict the application of embodiments described herein to any particular orientation.

Figure 1:
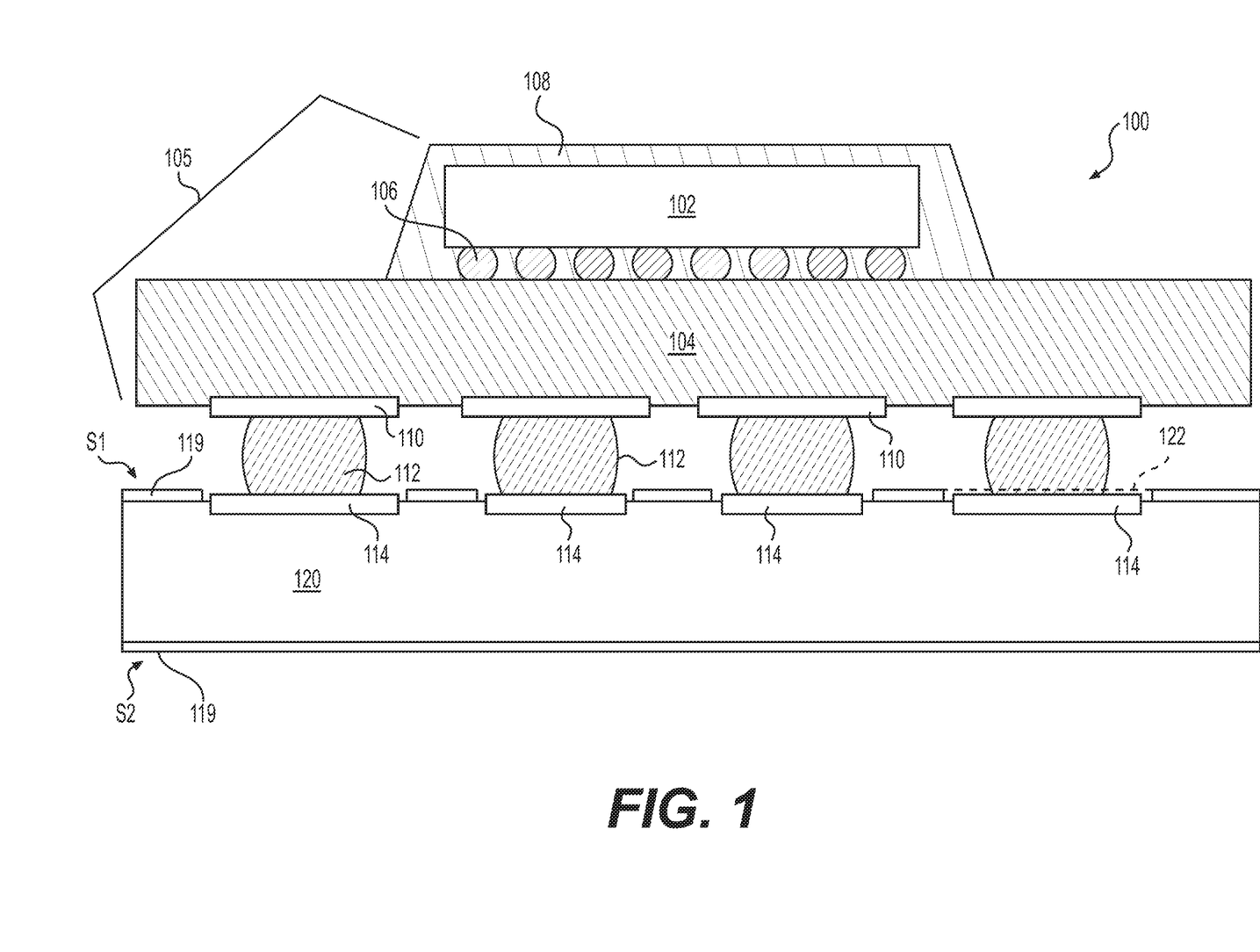
FIG. 1 schematically illustrates a cross-section side view of an example integrated circuit (IC) package assembly according to an example arrangement.

FIG. 1 schematically illustrates a cross-section side view of an example integrated circuit (IC) package assembly according to an example arrangement. Other arrangements and configurations may also be provided.

More specifically, FIG. 1 shows an integrated circuit (IC) package assembly 100. The IC package assembly 100 includes a die package assembly 105 including a package substrate 104 having one or more dies (hereinafter "die 102") mounted on the package substrate 104 and a circuit board 120 coupled with the die package assembly 105. The circuit board 120 may also be considered a printed circuit board (PCB).

The die 102 can be attached to the package substrate 104 according to a variety of suitable configurations including, a flip-chip configuration, as depicted, or other configurations such as wirebonding and the like. In the flip-chip configuration, an active side of the die 102 is attached to a surface of the package substrate 104 using die interconnect structures 106 such as bumps, pillars, or other suitable structures. The active side of the die 102 may have one or more transistor devices formed thereon. The die 102 may represent a discrete chip and may be, include, or be a part of a processor, memory, or an application specific integrated circuit (ASIC). An encapsulant 108 such as, for example, molding compound or underfill material may fully or partially encapsulate the die 102.

The die interconnect structures 106 may be configured to route electrical signals between the die 102 and the package substrate 104. In some embodiments, the electrical signals may include, for example, input/output (I/O) signals and/or power or ground signals associated with the operation of the die 102.

The package substrate 104 may include structures configured to route electrical signals to or from the die 102. The structures may include, for example, traces disposed on one or more surfaces of the package substrate 104 and/or internal such as, for example, trenches, vias or other interconnect structures to route electrical signals through the package substrate 104. For example, in some embodiments, the package substrate 104 may include structures such as die bond pads configured to receive the die interconnect structures 106 and route electrical signals between the die 102 and the package substrate 104.

The package substrate 104 may be an epoxy-based laminate substrate having a core and/or build-up layers such as, for example, an Ajinomoto Build-up Film (ABF) substrate. The package substrate 104 may include other suitable types of substrates in other embodiments including, for example, substrates formed from glass, ceramic, or semiconductor materials.

Package level interconnects including solder material such as, for example, solder balls 112 may be coupled to one or more pads (hereinafter "pads 110") on the package substrate 104 and/or one or more pads (hereinafter "pads 114") on circuit board to form corresponding solder joints that are configured to further route the electrical signals of the die 102 to the circuit board 120. As will be described below, the solder balls 112 may be mounted directly on a via and/or on a terminal of a passive device. Additionally, the solder balls may be provided on a pad very near to a terminal of a passive device.

The circuit board 120 may be a printed circuit board (PCB) composed of an electrically insulative material such as an epoxy laminate. For example, the circuit board 120 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures such as conductive traces, trenches, vias may be formed through the electrically insulating layers to route the electrical signals of the die 102 through the circuit board 120. The circuit board 120 may be composed of other suitable materials in other embodiments.

FIG. 1 shows only a portion of the circuit board 120. The circuit board 120 may include other electrical devices coupled to the circuit board 120 that are configured to route electrical signals to or from the die 102 through the circuit board 120. The circuit board 120 may be a motherboard.

According to various embodiments, the circuit board 120 may include one or more passive devices. As will be described below, the passive devices may be provided within vias in order to conserve real estate on the top and bottom of the circuit board. The passive devices may include one or more of inductors, capacitors, resistors, and the like.

The circuit board 120 may include a first surface S1 and a second surface S2 opposite to the first surface S1. In some embodiments, the first surface S1 and/or the second surface S2 includes a solder resist layer 119 formed to protect surfaces of the circuit board 120 that do not form solder connections with the solder balls 112. Openings such as opening 122 may be formed or otherwise provided in the solder resist layer 119 to expose surfaces of the pads 114 to allow formation of solder connections with the solder balls 112. Vias may also be provided at various locations between the first surface S1 and the second surface S2.

Figure 2A:
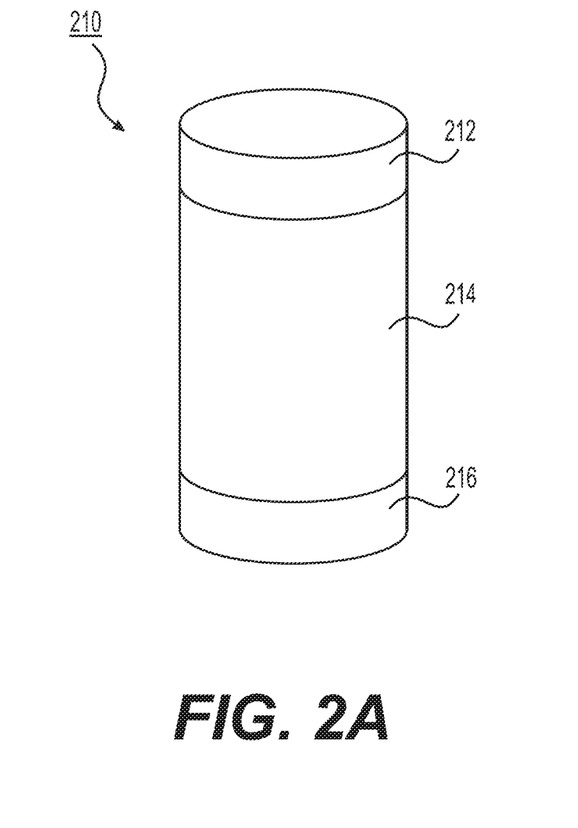
FIGS. 2A and 2B show two passive devices according to an example embodiment.
Figure 2B:
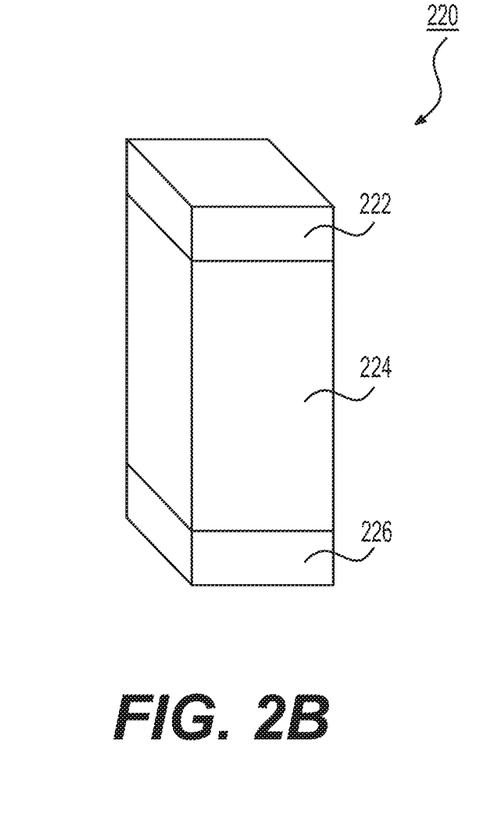

FIGS. 2A and 2B show two passive devices according to an example embodiment. Other embodiments and configurations may also be provided.

More specifically, FIG. 2A shows a passive device 210 in a cylindrical shape (or circular shape). As one example, the cylindrical shape may be provided such that the passive device may be vertically inserted into a via and thereafter be maintained in the via. The passive device 210 may any one of a resistor, an inductor and a capacitor, for example. The passive device may be constructed to perform the functionality of the corresponding device. For example, the passive device may perform the functions of a resistor, the passive device may perform the functions of an inductor, and/or the passive device may perform the functions of a capacitor.

The passive device 210 (in the cylindrical shape) may include a first terminal 212, a middle section 214 and a second terminal 216. In at least one embodiment, the first terminal 212 may be made of a conductive material to receive signals and/or voltages from traces of the circuit board. For example, the first terminal 212 may contact a conductive trace on (or at) a layer of the circuit board. The second terminal 216 may also be made of a conductive material to provide signals or voltages to the circuit board. For example, the second terminal 216 may contact a conductive trace on (or at) a layer of the circuit board. The middle section 214 may be made of a non-conductive material. The non-conductive material may be a specific material based on the specific function of the passive device. The combination of the first terminal 212, the middle section 214 and the second terminal 216 may form the respective passive device.

For a passive device which is a resistor, the middle section 214 (or center core) may be made of a partial conductor of electricity as a function of its value measured in Ohms. For example, a very conductive resistor may yield 0 or 1 ohm whereas a poor conductor resistor may be in the 100 k ohm range. The first and second terminals 212, 216 may be composed of highly conductive material to minimize resistance and maximize solderability. Resistors may be used to limit current in analog circuitry and/or may be used for pull-up and pull-down current paths in digital circuitry.

For a passive device which is a capacitor, the first and second terminals 212, 216 may be separated by a dielectric material (at the middle section 214) where the dielectric material is measured in farads. The capacitor (i.e., the passive device) may be used to filter and store energy. The capacitor located closest to a processor (such as a microprocessor), such as directly under the processor, may be considered a bypass capacitor for filtering unwanted electrical noise/signals.

For a passive device which is an inductor, the middle section 214 may be an inductor body which may be a coiled wire encased in a ceramic or epoxy material. The first and second terminals 212, 216 may be made of a high conductive material to maximize solderability. The inductor may store magnetic energy created by an electric current. The inductor (as the passive device) may be used to suppress current spikes on power rails.

FIG. 2B shows a passive device 220 in a rectangular shape, such as a square shape. As one example, the rectangular shape may be vertically inserted into a via and thereafter maintained in the via. Rectangular devices may be provided within the via as long as an inner radius of the via matches a hypotenuse of the rectangular passive device. The radius of the via may be designed (or determined) prior to manufacturing of the PCB. The passive device 220 may any one of a resistor, an inductor and a capacitor, for example. The passive device 220 may be constructed to perform the functionality of the corresponding device.

The passive device 220 (in the rectangular shape) may include a first terminal 222, a middle section 224 and a second terminal 226. In at least one embodiment, the first terminal 222 may be made of a conductive material to receive signals and/or voltages from traces of the circuit board. For example, the first terminal 222 may contact a conductive trace on (or at) a layer of the circuit board. The second terminal 226 may also be made of a conductive material to provide signals or voltages to the circuit board. For example, the second terminal 226 may contact a conductive trace on (or at) a layer of the circuit board. The middle section 224 may be made of a non-conductive material. The non-conductive material may be a specific material based on the specific function of the passive device. The combination of the first terminal 222, the middle section 224 and the second terminal 226 may form the respective passive device.

A copper structure may be provided at portions of the via in order to provide a connection with the passive device when the passive device is provided in the via. In at least one embodiment, the passive device is vertically provided into the via. A thin layer of solder paste may be provided on (or at) a first end of the passive device provided into the via. The solder paste may keep small components locked in position through surface tension. An infrared (IR) oven may be used to heat up the solder paste at the first end of the passive device, and thereby solder the passive device to the circuit board.

A thin layer of solder paste may be provided at a second end of the passive device provided in the via. An IR oven may be used to heat up the solder paste at the second end of the passive device, and thereby solder the passive device to the circuit board.

Figure 3:
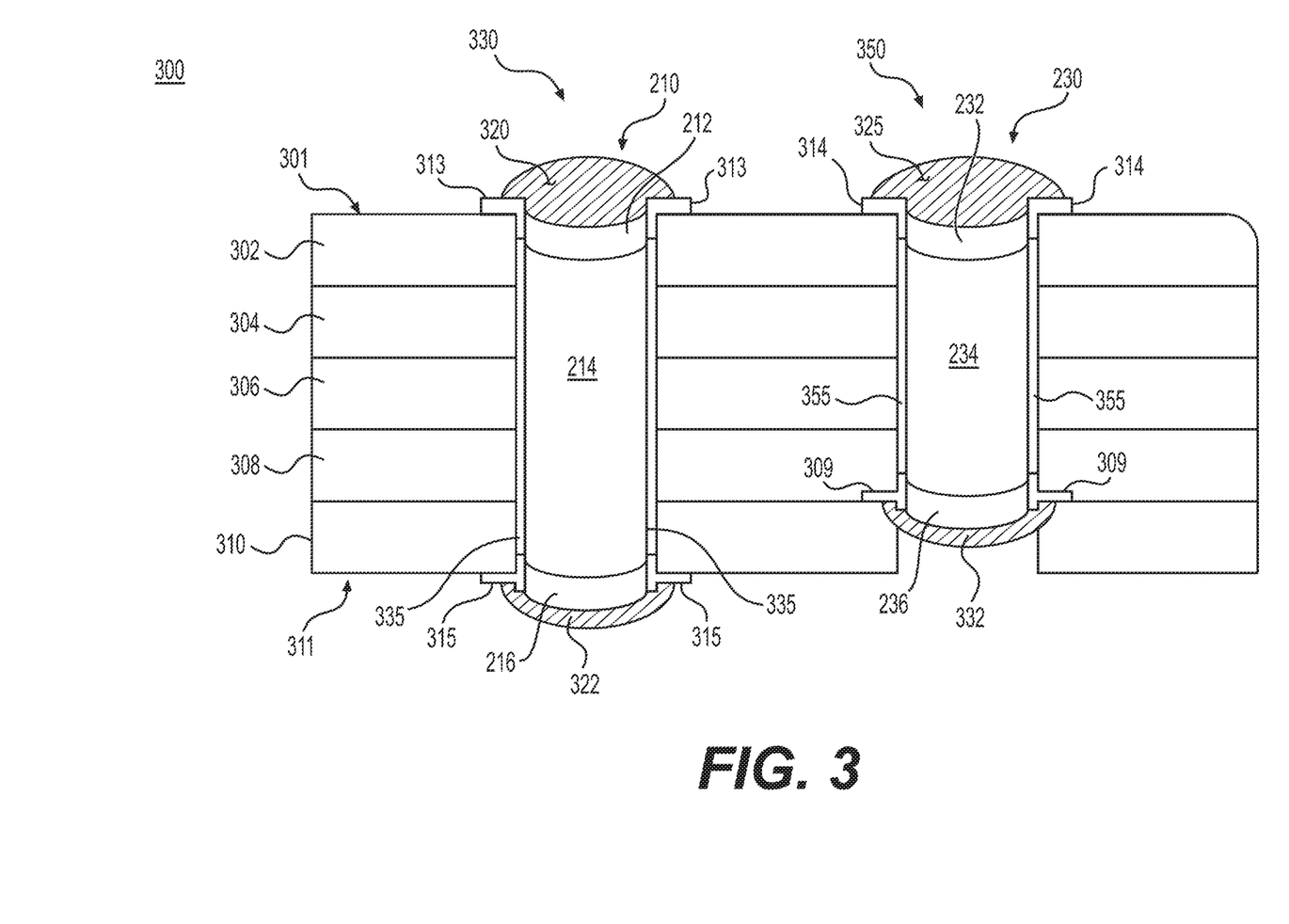
FIG. 3 shows a printed circuit board having two passive devices in two separate vias according to an example embodiment.

FIG. 3 shows a printed circuit board having two passive devices in two separate vias according to an example embodiment. Other embodiments and configurations may also be provided.

More specifically, FIG. 3 shows a printed circuit board (PCB) 300. The circuit board 300 may correspond to the circuit board 120 discussed above. The circuit board 300 may have a plurality of layers 302, 304, 306, 308 and 310. Each of the layers may be formed of a non-conductive material, such as electrically insulating layers as discussed above. The circuit board 300 may include a plurality of insulating layers (such as layers 302, 304, 306, 308, 310) provided in a stack (or stacked manner).

The PCB 300 may have a first surface 301 on a top surface of the PCB 300. The PCB may have a second surface 311 on a bottom surface of the PCB 300. FIG. 3 shows the PCB 300 includes two vias, namely a first via 330 and a second via 350. Other numbers of vias may also be provided. The first via 330 may extend from the first surface 301 of the stack (of insulating layers) to the second surface 311 of the stack (of insulating layers).

A first passive device may be vertically provided within the via 330, and a second passive device may be vertically provided within the via 350. For example, a passive device 210 may be provided within the first via 330, and a passive device 230 may be provided within the second via 350.

FIG. 3 shows that a first copper structure 313 may be provided at the first surface 301 and at a top portion of the via 330. The first copper structure 313 may electrically couple to a first conductive trace on the first surface of the circuit board 300. In at least one embodiment, the first copper structure 313 may electrically couple to the first terminal 212 when the passive device 210 is provided in the first via 330. Solder paste 320 may be provided on the passive device 210 within the first via 330. The solder paste 320 may also be provided on the first copper structure 313. In at least one embodiment, the solder past 320 may be provided on the first terminal 212 and on the first copper structure 313.

Additionally, FIG. 3 shows a second copper structure 314 may be provided at the first surface 301 and at a top portion of the second via 350. The second copper structure 314 may electrically couple to a second conductive trace on the first surface of the circuit board 300. In at least one embodiment, the second copper structure 314 may electrically couple to the first terminal 232 of the passive device 230 when the passive device 230 is provided in the second via 350. Solder paste 325 may be provided on the passive device 210 within the first via 330. The solder paste 325 may also be provided on the second copper structure 313. In at least one embodiment, the solder past 325 may be provided on the first terminal 230 and on the second copper structure 314.

In at least one embodiment, the passive device 210 may have a cylindrical shape as discussed above with respect to FIG. 2A. In another embodiment, the passive device 210 may have a different shape, such as a rectangular shape.

In at least one embodiment, the passive device 230 may have a cylindrical shape as discussed above with respect to FIG. 2A. In another embodiment, the passive device 230 may have a different shape, such as a rectangular shape.

FIG. 3 shows that the passive device 210 extends from a top of the PCB 300 and extends to the bottom of the PCB 300. The first terminal 212 of the passive device 210 may be electrically connected to the first copper structure 313 at the top surface of the PCB 300 and/or a side of the first via 330. For example, FIG. 3 shows the first terminal 212 of the passive device 210 connected to at least the first copper structure 313 (on the top surface of the PCB 300 and a side surface of the via 330). The conductive trace may be provided on the top surface of the PCB 300, for example. The conductive trace may serve any of a number of different functions. For example, the conductive trace may be a voltage trace that provides a voltage. The conductive trace may be a signal line that provides a respective signal on the conductive trace. The conductive trace may also be a ground trace.

The middle section 214 of the passive device may extend thru the via 330 to the second terminal 216 of the passive device 210. In this embodiment, the second terminal 216 of the passive device 210 may be electrically connected to a conductive trace on the bottom surface of the PCB 300. For example, FIG. 3 shows the second terminal 216 of the passive device 210 connected to at least a third copper structure 315 (on the bottom of the PCB 300). The third copper structure 315 may couple to a conductive trace at the second surface 311 of the circuit board 300. The conductive trace may serve any of a number of different functions. For example, the conductive trace may be a voltage trace that provides a voltage. The conductive trace may be a signal line that provides a respective signal on the conductive trace. The conductive trace may also be a ground trace.

As shown in FIG. 3, a space 335 may be provided along vertical sides of the first via 330. The space 335 may be provided between the first copper structure 313 and the third copper structure 315. In at least one embodiment, the space 335 may be a non-conductive material. In at least one embodiment, the space 335 may be air.

The passive devices may be provided in the vias in order to conserve space on top (and bottom) of the circuit board. The passive devices may be connected to different copper structures and/or conductive traces of the circuit board while in the via. Accordingly, signals and voltages may be properly handled based on the functionality of the passive device (namely a resistor, an inductor and a capacitor).

FIG. 3 shows that the passive device 230 extends from a top of the PCB 300 and extends only part way thru the PCB 300. In other words, the passive device 230 does not extend fully thru the second via 350. The passive device 230 includes a first terminal 232, a middle section 234 and a third terminal 236. The first terminal 232 of the passive device 230 may be electrically connected to the second copper structure 314 on the top surface of the PCB 300 and/or the side surface of the second via 350. For example, FIG. 3 shows the first terminal 232 connected to at least a second copper structure 314 (on the top surface of the PCB 300), which may in turn connect to a conductive trace on the circuit board 300. The conductive trace may serve any of a number of different functions. For example, the conductive trace may be a voltage trace that provides a voltage. The conductive trace may be a signal line that provides a respective signal on the conductive trace. The conductive trace may also be a ground trace.

The middle section 214 of the PCB 230 may extend thru the via 350 to the second terminal 236 of the passive device 230. In this embodiment, the second terminal 236 of the passive device 230 may be electrically connected to a conductive trace on one of the layers of the PCB 300. For example, FIG. 3 shows the second terminal 236 of the passive device 230 connected to a fourth copper structure 309 which may connect to a conductive trace that may be provided on the layer 310 between the layer 308 and the layer 310. For example, FIG. 3 shows the second terminal 236 connected to at least the fourth copper structure 309. The fourth copper structure 309 may couple to a conductive trace at the layer of the circuit board 300. The conductive trace may serve any of a number of different functions. For example, the conductive trace may be a voltage trace that provides a voltage. The conductive trace may be a signal line that provides a respective signal on the conductive trace. The conductive trace may also be a ground trace.

As shown in FIG. 3, a space 3355 may be provided along vertical sides of the second via 330. The space 355 may be provided between the second copper structure 314 and the fourth copper structure 309. In at least one embodiment, the space 355 may be a non-conductive material. In at least one embodiment, the space 355 may be air.

FIG. 3 shows two embodiments of passive devices provided within vias of a PCB. The passive device may be inserted into the vias after manufacture of the PCB. The passive device may extend between any two layers of the PCB 300. In at least one embodiment, the passive device may extend from a top surface of the PCB 300 to a bottom surface of the PCB 300. In at least one embodiment, the passive device may extend from top surface to a conductive trace on one of the layers of the PCB 300. In at least one embodiment, the passive device may extend from a conductive trace on the one of the layers of the PCG 300 to the bottom surface of the PCB 300. In at least one embodiment, the passive device may extend from a conductive trace on one layer of the PCB 300 to a conductive trace on another layer of the PCB.

Figure 4:
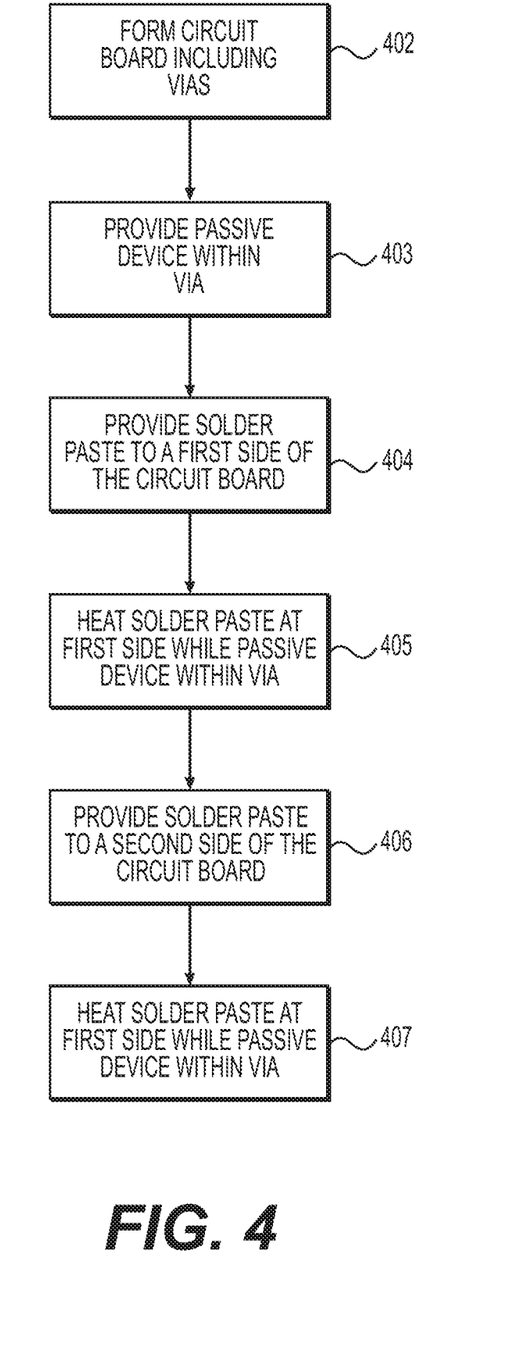
FIG. 4 is a flowchart of a method according to an example embodiment.

FIG. 4 is a flowchart of a method according to an example embodiment. Other embodiments, operations and orders of operations may be provided.

More specifically, FIG. 4 shows a method of fabricating a circuit board such that the circuit board has a passive device in a via.

The method may include forming a circuit board at operation 402. The circuit board may be formed using techniques such as, for example, lamination of electrically insulative materials, deposition of electrically conductive materials, patterning of the electrically conductive materials by additive or subtractive processes, creating holes or vias by mechanical means, laser drilling or etch process, the like and other techniques. Additionally, vias may be provided in operation 402.

In operation 403, a passive device may be provided within at least one via. For example, a plurality of passive devices may be provided into a plurality of vias. The passive devices may be provided manually, or by machine. In at least one embodiment, the passive device is provided after the circuit board has been properly fabricated.

Solder paste may be provided at a first surface of the circuit board in operation 404. For example, solder paste may be provided on a first end of the passive device.

In operation 405, the solder paste may be heated at the first side while the passive device in provided within the via. This may hold the passive device within the via.

In operation 406, the solder paste may be provided to a second side of the circuit board such as on the passive device.

In operation 407, the solder paste may be heated at the second side while the passive device is provided within the via. This may hold the passive device within the via.

Additional operations may include providing a package on one side of the circuit board as shown in FIG. 1.

Figure 5:
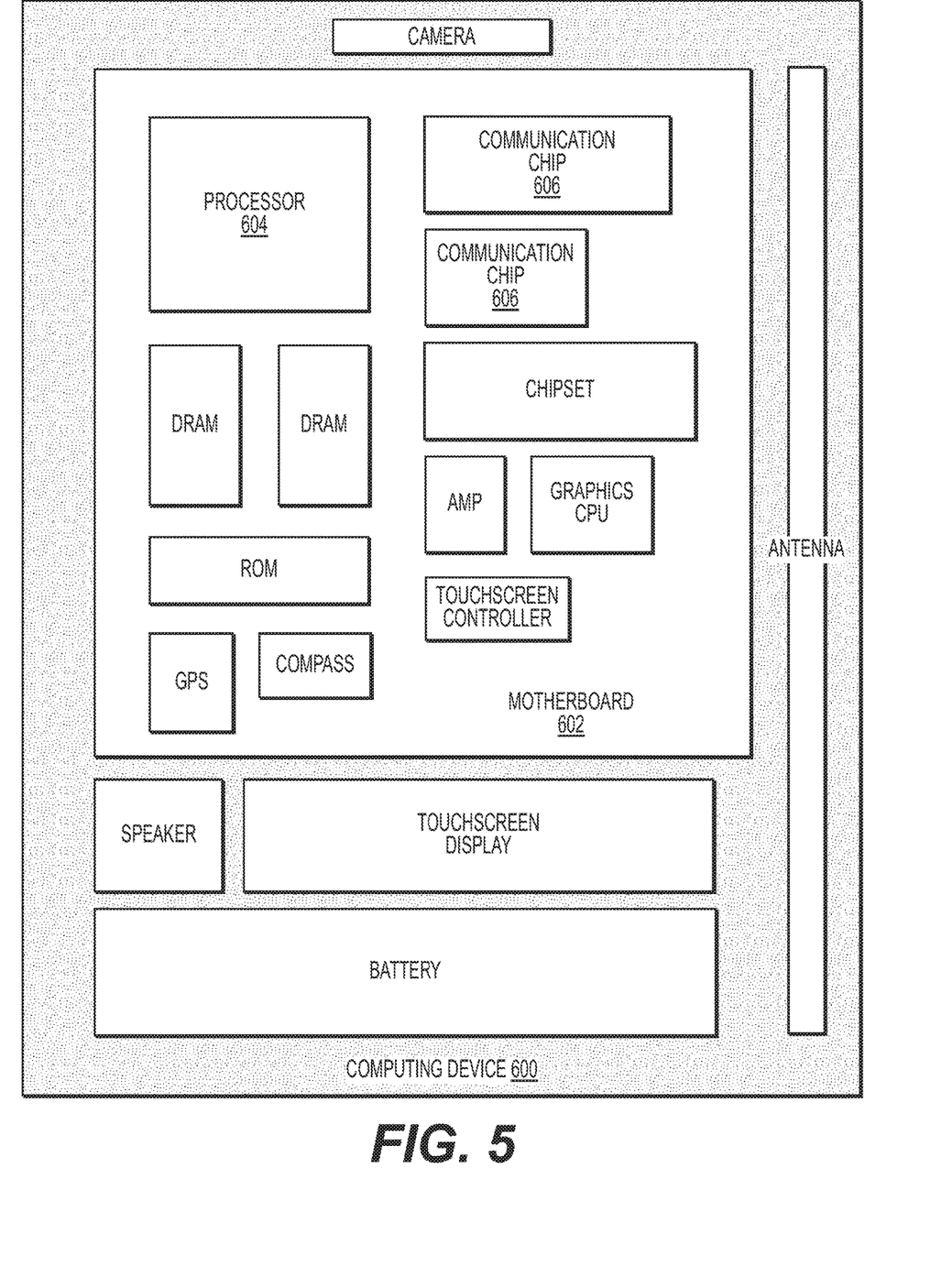
FIG. 5 is a system level drawing showing a computing system according to an example embodiment.

Embodiments of the present disclosure may be implemented into a system using any suitable hardware and/or software to configure as desired. FIG. 5 schematically illustrates a computing device 600 in accordance with one implementation. The computing device 600 may house a board such as motherboard 602. According to various embodiments, the motherboard 602 may be a circuit board (e.g., circuit board 120 of FIG. 1) having one or more passive devices inserted into a via of the circuit board. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604. According to various embodiments, the processor 604, the communication chip 606 or other components (e.g., memory devices) described in connection with the computing device 600 may be in the form of one or more dies (e.g., die 102 of FIG. 1) as described herein. The one or more passive devices may be disposed in the motherboard 602 within a die shadow region of the one or more dies.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 may include a die (e.g., die 102 of FIG. 1) in an IC package assembly (e.g., IC package assembly 100 of FIG. 1) as described herein. The term "processor" may refer to any device or portion of a device that processes electronic data from registers and/or memory to transform that electronic data into other electronic data that may be stored in registers and/or memory.

The communication chip 606 may also include a die (e.g., die 102 of FIG. 1) in an IC package assembly (e.g., IC package assembly 100 of FIG. 1) as described herein. In further implementations, another component (e.g., memory device or other integrated circuit device) housed within the computing device 600 may contain a die (e.g., die 102 of FIG. 1) in an IC package assembly (e.g., IC package assembly 100 of FIG. 1) as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments may provide microscopic passive devices, and stand them on end and slide them into a via where a first end of the component can contact a top layer directly and a second end of the component may contact the bottom layer or internal layer. This may effectively eliminate the real estate required to locate the component or device on the surface of the circuit board.

Embodiments may provide a passive device (or component) vertically into a via to eliminate the need for real estate on the top or bottom of the circuit board.

Embodiments may provide several advantages. For example, the passive device may take advantage of vias under packages or SOC's. The passive device provided inside the via may eliminates the need for real estate on the top or bottom surface of the circuit board. Passive devices, such as capacitors, may be connected directly under a solder (or BGA) ball which may be ideal for bypass. Passive devices in a via directly under a BGA ball may help minimize "wicking". Additionally, passive devices inside a via with direct contact to a package or SOC may have thermal transfer benefits.

The following examples pertain to further embodiments.

Example 1 is a circuit board comprising: a plurality of insulating layers provided in a stack to have a first surface and a second surface; a via that extends from the first surface of the stack to the second surface of the stack; and a passive device provided in the via.

In Example 2, the subject matter of Example 1 can optionally include the passive device is one of a resistor, a capacitor and an inductor.

In Example 3, the subject matter of Example 1 can optionally include the passive device has a cylindrical shape.

In Example 4, the subject matter of Example 1 can optionally include the passive device has a rectangular shape.

In Example 5, the subject matter of Example 1 can optionally include the passive device includes a first terminal at a first end of the passive device, a second terminal at a second end of the passive device, and a middle section between the first terminal and the second terminal.

In Example 6, the subject matter of Example 1 and Example 5 can optionally include the first terminal includes a conductive material, and the second terminal includes a conductive material.

In Example 7, the subject matter of Example 1 and Example 6 can optionally include the middle section includes a dielectric material.

In Example 8, the subject matter of Example 1 and Example 6 can optionally include the middle section includes a coiled wire encased in a ceramic or epoxy material.

In Example 9, the subject matter of Example 1 and Example 5 can optionally include the first terminal is to couple to a first conductive trace at the circuit board, and the second terminal is to connect to a second conductive trace at the circuit board.

In Example 10, the subject matter of Example 1 and Example 9 can optionally include the first conductive trace is at a top surface of the circuit board.

In Example 11, the subject matter of Example 1 and Example 9 can optionally include the second conductive trace is at a bottom surface of the circuit board.

In Example 12, the subject matter of Example 1 and Example 9 can optionally include the second conductive trace is between two of the plurality of insulating layers.

In Example 13, the subject matter of Example 1 and Example 5 can optionally include first solder paste at the first terminal of the passive device, and second solder paste at the second terminal of the passive device.

In Example 14, the subject matter of Example 1 and Example 13 can optionally include a first copper structure at the via between one of the insulating layers and the first terminal of the passive device.

In Example 15, the subject matter of Example 1 and Example 14 can optionally include a second copper structure at the via between one of the insulating layers and the second terminal of the passive device.

In Example 16, the subject matter of Example 1 and Example 15 can optionally include a space at the via between the first copper structure and the second copper structure.

In Example 17, the subject matter of Example 1 and Example 16 can optionally include the space includes a non-conductive material.

In Example 18, the subject matter of Example 1 and Example 16 can optionally include the space includes air.

In Example 19, the subject matter of Example 1 can optionally include a first conductive trace on a first one of the insulating layers; and a second conductive trace on a second one of the insulating layers.

Example 20 is an apparatus comprising: a circuit board having a plurality of insulating layers provided in a stack, and the circuit board having a first surface and a second surface, the circuit board including a via that extends from the first surface to the second surface; and a passive device provided in the via.

In Example 21, the subject matter of Example 20 can optionally include the passive device is one of a resistor, a capacitor and an inductor.

In Example 22, the subject matter of Example 20 can optionally include the passive device has a cylindrical shape.

In Example 23, the subject matter of Example 20 can optionally include the passive device has a rectangular shape.

In Example 24, the subject matter of Example 20 can optionally include the passive device includes a first terminal at a first end of the passive device, a second terminal at a second end of the passive device, and a middle section between the first terminal and the second terminal.

In Example 25, the subject matter of Example 20 and Example 24 can optionally include the first terminal includes a conductive material, the second terminal includes a conductive material.

In Example 26, the subject matter of Example 20 and Example 25 can optionally include the middle section includes a dielectric material.

In Example 27, the subject matter of Example 20 and Example 25 can optionally include the middle section includes a coiled wire encased in a ceramic or epoxy material.

In Example 28, the subject matter of Example 20 and Example 24 can optionally include the first terminal is to couple to a first conductive trace at the circuit board, and the second terminal is to connect to a second conductive trace at the circuit board.

In Example 29, the subject matter of Example 20 and Example 28 can optionally include the first conductive trace is at a top surface of the circuit board.

In Example 30, the subject matter of Example 20 and Example 28 can optionally include the second conductive trace is at a bottom surface of the circuit board.

In Example 31, the subject matter of Example 20 and Example 28 can optionally include the second conductive trace is between two of the plurality of insulating layers.

In Example 32, the subject matter of Example 20 and Example 24 can optionally include first solder paste at the first terminal of the passive device, and second solder paste at the second terminal of the passive device.

In Example 33, the subject matter of Example 20 and Example 32 can optionally include a first copper structure at the via between one of the insulating layers and the first terminal of the passive device.

In Example 34, the subject matter of Example 20 and Example 33 can optionally include a second copper structure at the via between one of the insulating layers and the second terminal of the passive device.

In Example 35, the subject matter of Example 20 and Example 34 can optionally include a space at the via between the first copper structure and the second copper structure.

In Example 36, the subject matter of Example 20 and Example 35 can optionally include the space includes a non-conductive material.

In Example 37, the subject matter of Example 20 and Example 36 can optionally include the space includes air.

In Example 38, the subject matter of Example 20 24 can optionally include the circuit board includes: a first conductive trace on a first one of the insulating layers; and a second conductive trace on a second one of the insulating layers.

Example 39 is a system comprising: a circuit board having a plurality of insulating layers provided in a stack, and the circuit board having a first surface and a second surface, the circuit board including a via that extends from the first surface to the second surface; a passive device provided in the via; and a package assembly coupled to the circuit board.

In Example 40, the subject matter of Example 39 can optionally include the package assembly is coupled to the circuit board by a ball.

In Example 41, the subject matter of Example 39 and Example 40 can optionally include the ball is a solder ball.

In Example 42, the subject matter of Example 39 can optionally include the package assembly include a die.

In Example 43, the subject matter of Example 39 can optionally include the passive device is one of a resistor, a capacitor and an inductor.

In Example 44, the subject matter of Example 39 can optionally include the passive device has a cylindrical shape.

In Example 45, the subject matter of Example 39 can optionally include the passive device has a rectangular shape.

In Example 46, the subject matter of Example 39 can optionally include the passive device includes a first terminal at a first end of the passive device, a second terminal at a second end of the passive device, and a middle section between the first terminal and the second terminal.

In Example 47, the subject matter of Example 39 and Example 46 can optionally include the first terminal includes a conductive material, and the second terminal includes a conductive material.

In Example 48, the subject matter of Example 39 and Example 47 can optionally include the middle section includes a dielectric material.

In Example 49, the subject matter of Example 39 and Example 47 can optionally include the middle section includes a coiled wire encased in a ceramic or epoxy material.

In Example 50, the subject matter of Example 39 and Example 46 can optionally include the first terminal is to couple to a first conductive trace at the circuit board, and the second terminal is to couple to a second conductive trace at the circuit board.

In Example 51, the subject matter of Example 39 and Example 50 can optionally include the first conductive trace is at a top surface of the circuit board.

In Example 52, the subject matter of Example 39 and Example 50 can optionally include the second conductive trace is at a bottom surface of the circuit board.

In Example 53, the subject matter of Example 39 and Example 50 can optionally include the second conductive trace is between two of the plurality of insulating layers.

In Example 54, the subject matter of Example 39 and Example 46 can optionally include first solder paste at the first terminal of the passive device, and second solder paste at the second terminal of the passive device.

In Example 55, the subject matter of Example 39 and Example 54 can optionally include a first copper structure at the via between one of the insulating layers and the first terminal of the passive device.

In Example 56, the subject matter of Example 39 and Example 55 can optionally include a second copper structure at the via between one of the insulating layers and the second terminal of the passive device.

In Example 57, the subject matter of Example 39 and Example 56 can optionally include a space at the via between the first copper structure and the second copper structure.

In Example 58, the subject matter of Example 39 and Example 57 can optionally include the space includes a non-conductive material.

In Example 59, the subject matter of Example 39 and Example 57 can optionally include the space includes air.

In Example 60, the subject matter of Example 39 can optionally include the circuit board includes: a first conductive trace on a first one of the insulating layers; and a second conductive trace on a second one of the insulating layers.

Example 61 is a method comprising: forming a circuit board having a plurality of insulating layers; forming a via in the circuit board; and providing a passive device in the via of the circuit board.

In Example 62, the subject matter of Example 61 can optionally include providing solder paste at a first side of the circuit board.

In Example 63, the subject matter of Example 61 and Example 62 can optionally include heating the solder paste at the first side while the passive device is within the via.

In Example 64, the subject matter of Example 61 and Example 62 can optionally include providing solder paste at a second side of the circuit board.

In Example 65, the subject matter of Example 61 and Example 64 can optionally include heating the solder paste at the second side while the passive device is within the via.

In Example 66, the subject matter of Example 61 can optionally include the passive device is one of a resistor, a capacitor and an inductor.

In Example 67, the subject matter of Example 61 can optionally include the passive device has a cylindrical shape.

In Example 68, the subject matter of Example 61 can optionally include the passive device has a rectangular shape.

In Example 69, the subject matter of Example 61 can optionally include the passive device includes a first terminal at a first end of the passive device, a second terminal at a second end of the passive device, and a middle section between the first terminal and the second terminal.

In Example 70, the subject matter of Example 61 and Example 69 can optionally include the first terminal includes a conductive material, and the second terminal includes a conductive material.

In Example 71, the subject matter of Example 61 and Example 70 can optionally include the middle section includes a dielectric material.

In Example 72, the subject matter of Example 61 and Example 70 can optionally include the middle section includes a coiled wire encased in a ceramic or epoxy material.

In Example 73, the subject matter of Example 61 and Example 69 can optionally include the first terminal is to couple to a first conductive trace at the circuit board, and the second terminal is to couple to a second conductive trace at the circuit board.

In Example 74, the subject matter of Example 61 and Example 73 can optionally include the first conductive trace is at a top surface of the circuit board.

In Example 75, the subject matter of Example 61 and Example 73 can optionally include the second conductive trace is at a bottom surface of the circuit board.

In Example 76, the subject matter of Example 61 and Example 73 can optionally include the second conductive trace is between two of the plurality of insulating layers.

In Example 77, the subject matter of Example 61 and Example 66 can optionally include first solder paste at the first terminal of the passive device, and second solder paste at the second terminal of the passive device.

In Example 78, the subject matter of Example 61 and Example 77 can optionally include a first copper structure at the via between one of the insulating layers and the first terminal of the passive device.

In Example 79, the subject matter of Example 61 and Example 78 can optionally include a second copper structure at the via between one of the insulating layers and the second terminal of the passive device.

In Example 80, the subject matter of Example 61 and Example 79 can optionally include a space at the via between the first copper structure and the second copper structure.

In Example 81, the subject matter of Example 61 and Example 80 can optionally include the space includes a non-conductive material.

In Example 82, the subject matter of Example 61 and Example 80 can optionally include the space includes air.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A circuit board comprising:
   a plurality of insulating layers provided in a stack, including a first outermost insulating layer having a top surface of the stack, a second outermost insulating layer having a bottom surface of the stack, and one or more intermediate insulating layers between the first and second outermost insulating layers, the plurality of insulating layers being formed of non-conductive materials;
   a via that extends from the top surface of the stack to the bottom surface of the stack; and
   a passive device provided in the via, spanning a portion but not an entire length of the via, with a first terminal disposed at a first end of the passive device immediately adjacent to the top surface of the stack, and a second terminal disposed at a second end of the passive device immediately adjacent to a top surface of one of the one or more intermediate insulating layers;
   a first connector structure to couple the first terminal of the passive device to a conductive trace on the top surface of the stack, and a second connector structure to couple the second terminal to a conductive trace on the immediately adjacent top surface of the one of intermediate insulating layer; and
   a space disposed along a vertical side of the via separating the first and second connector structures.

2. The circuit board of claim 1, wherein the passive device is one of a resistor, a capacitor and an inductor.

3. The circuit board of claim 1, wherein the passive device has a cylindrical shape.

4. The circuit board of claim 1, wherein the passive device has a rectangular shape.

5. The circuit board of claim 1, wherein the first terminal includes a conductive material, and the second terminal includes a conductive material.

6. The circuit board of claim 1, further comprising first solder paste at the first terminal of the passive device, and second solder paste at the second terminal of the passive device.

7. The circuit board of claim 1, wherein the first and second connector structures are copper structures.

8. The circuit board of claim 1, wherein the passive device further includes a middle section between the first and second terminals, constituted with a dielectric material or a coiled wire encased in a ceramic or epoxy material.

9. A system comprising:
- a circuit board having a plurality of insulating layers provided in a stack, including a first outermost insulating layer having a top surface of the stack, a second outermost insulating layer having a bottom surface of the stack, and one or more intermediate insulating layers between the first and second outermost insulating layers, and a via that extends from the top surface to the bottom surface, the plurality of insulating layers being formed of non-conductive materials;
- a passive device provided in the via, spanning a portion but not an entire length of the via, with a first terminal disposed at a first end of the passive device proximal immediately adjacent to the top surface of the stack, and a second terminal disposed at a second end of the passive device immediately adjacent to a top surface of one of the one or more intermediate insulating layers;
- a first connector structure to couple the first terminal of the passive device to a conductive trace on the top surface of the stack, and a second connector structure to couple the second terminal to a conductive trace on the immediately adjacent top surface of the one intermediate insulating layer;
- a space disposed along a vertical side of the via separating the first and second connector structures; and
- a package assembly coupled to the circuit board.

10. The system of claim 9, wherein the package assembly is coupled to the circuit board by a ball.

11. The system of claim 9, wherein the package assembly includes a die.

12. The system of claim 9, wherein the passive device is one of a resistor, a capacitor and an inductor.

13. A method comprising:
- forming a circuit board having a plurality of insulating layers in a stack, including a first outermost insulating layer having a top surface of the stack, a second outermost insulating layer having a bottom surface of the stack, and one or more intermediate insulating layers between the first and second outermost insulating layers, the plurality of insulating layers being formed of non-conductive materials;

- forming a via in the circuit board, extending from the top surface of the stack to the bottom surface of the stack;

- providing a passive device in the via of the circuit board, that spans a portion but not an entire length of the via, with a first terminal disposed at a first end of the passive device immediately adjacent to the top surface of the stack, and a second terminal disposed at a second end of the passive device immediately adjacent to a top surface of one of the one or more intermediate insulating layer; and

- with a first and a second connector structure, coupling the first terminal of the passive device to a conductive trace on the top surface of the stack, and coupling the second connector structure to a conductive trace on the immediately adjacent top surface of the one intermediate insulating layer, including providing a space along a vertical side of the via to separate the first and second connector structures.

14. The method of claim 13, further comprising:
- providing solder paste at the first terminal or the second terminal of the passive device.

15. The method of claim 14, further comprising:
- heating the solder paste at the first terminal or the second terminal of the passive device coupled by the plurality of connector structures to the conductive trace on one of the intermediate insulating layers, while the passive device is within the via.

* * * * *